United States Patent
Krasnov

(10) Patent No.: US 9,691,917 B2
(45) Date of Patent: Jun. 27, 2017

(54) BACK CONTACT HAVING SELENIUM BLOCKING LAYER FOR PHOTOVOLTAIC DEVICES SUCH AS COPPER-INDIUM-DISELENIDE SOLAR CELLS

(71) Applicant: Guardian Industries Corp., Auburn Hills, MI (US)

(72) Inventor: Alexey Krasnov, Canton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 14/856,683

(22) Filed: Sep. 17, 2015

(65) Prior Publication Data

US 2016/0005891 A1    Jan. 7, 2016

Related U.S. Application Data

(62) Division of application No. 13/729,074, filed on Dec. 28, 2012, now Pat. No. 9,159,850.

(51) Int. Cl.
| H01L 31/00 | (2006.01) |
| H01L 31/0224 | (2006.01) |
| H01L 31/0392 | (2006.01) |
| H01L 31/18 | (2006.01) |

(52) U.S. Cl.
CPC ........ *H01L 31/022441* (2013.01); *H01L 31/022425* (2013.01); *H01L 31/03923* (2013.01); *H01L 31/18* (2013.01); *Y02E 10/541* (2013.01)

(58) Field of Classification Search
CPC .............................. H01L 31/022441
See application file for complete search history.

(56) References Cited

U.S. PATENT DOCUMENTS

| 4,335,266 A | 6/1982 | Mickelsen et al. |
| 4,611,091 A | 9/1986 | Choudary et al. |
| 6,123,824 A | 9/2000 | Sano et al. |
| 6,288,325 B1 | 9/2001 | Jansen et al. |
| 6,784,361 B2 | 8/2004 | Carlson et al. |
| 7,875,945 B2 | 1/2011 | Krasnov et al. |
| 2004/0261841 A1 | 12/2004 | Negami et al. |
| 2005/0026428 A1* | 2/2005 | Choi ............ H01L 21/28518 438/682 |
| 2006/0180200 A1 | 8/2006 | Bjorkman et al. |
| 2007/0193623 A1 | 8/2007 | Krasnov |
| 2008/0138539 A1 | 6/2008 | Breitung et al. |
| 2008/0280030 A1 | 11/2008 | Van Duren et al. |
| 2010/0300512 A1 | 12/2010 | Auvray et al. |
| 2010/0311103 A1 | 12/2010 | Boukherroub et al. |

(Continued)

OTHER PUBLICATIONS

U.S. Appl. No. 13/729,074, filed Dec. 28, 2012; Krasnov.

(Continued)

*Primary Examiner* — Robert Vetere
(74) *Attorney, Agent, or Firm* — Nixon & Vanderhye P.C.

(57) ABSTRACT

A photovoltaic device (e.g., solar cell) includes: a front substrate (e.g., glass substrate); a semiconductor absorber film; a back contact including a first conductive layer of or including copper (Cu) and a second conductive layer of or including molybdenum (Mo); and a rear substrate (e.g., glass substrate). A selenium blocking layer is provided between at least the Cu inclusive layer and the Mo inclusive layer.

8 Claims, 2 Drawing Sheets

(56) References Cited

U.S. PATENT DOCUMENTS

| | | | |
|---|---|---|---|
| 2011/0247687 A1* | 10/2011 | Zhang | H01L 31/0296 |
| | | | 136/256 |
| 2012/0055543 A1* | 3/2012 | Pinarbasi | H01L 31/0322 |
| | | | 136/256 |
| 2013/0284251 A1 | 10/2013 | Krasnov et al. | |
| 2013/0306468 A1 | 11/2013 | Matsumoto et al. | |

OTHER PUBLICATIONS

U.S. Appl. No. 13/455,232, filed Apr. 25, 2012; Krasnov et al.
U.S. Appl. No. 13/455,282, filed Apr. 25, 2012; Krasnov.
U.S. Appl. No. 13/455,317, filed Apr. 25, 2012; Krasnov et al.
U.S. Appl. No. 13/455,300, filed Apr. 25, 2012; Krasnov.

\* cited by examiner

BACK CONTACT HAVING SELENIUM BLOCKING LAYER FOR PHOTOVOLTAIC DEVICES SUCH AS COPPER-INDIUM-DISELENIDE SOLAR CELLS

CROSS-REFERENCE TO RELATED APPLICATION

This application is a division of Application Ser. No. 13/729,074, now U.S. Pat No. 9,159,850, filed Dec. 28, 2012, which is related to Application Ser. No. 13/455,232, filed Apr. 25, 2012, the entire disclosure of which are hereby all incorporated herein by reference in this application.

TECHNICAL FIELD

Certain embodiments of this disclosure relate generally to photovoltaic devices (e.g., solar cells), a back contact or rear electrode for use in photovoltaic devices such as solar cells, coated articles for use in photovoltaic devices such as solar cells, and methods of making the same. Certain embodiments of this disclosure more particularly relate to a molybdenum-containing back electrode configuration that incorporates other metallic elements resulting in a lower-cost, high-efficiency solar cells. The back (or rear) electrode may also function as a rear reflector in certain example instances. According to certain example embodiments disclosed herein, a substantial portion of the traditional molybdenum back contact typically used in CIGS solar cells is substituted with copper, which is compatible with the CIGS absorber layer and does not significantly compromise performance of the solar cell. A selenium blocking layer(s) is also provided in the back/rear electrode, e.g., between a Mo based layer and a Cu based layer.

BACKGROUND AND SUMMARY OF EXAMPLE EMBODIMENTS

Many different types of photovoltaic devices are known in the art (e.g., see U.S. Patent Document Nos. 2004/0261841, 2006/0180200, U.S. Pat. Nos. 4,335,266, 4,611,091, 6,784,361, 6,288,325, 6,631,603, and 6,123,824, the disclosures of which are incorporated by reference herein in their entireties). Examples of known photovoltaic devices include CIGS (approximately $Cu(In, Ga)(Se,S)_2$ and/or $CuIn_{x-1}Ga_xSe_2$) solar cells. CIGS films are conductive semiconductor compounds that are often referred to as an absorber or light absorbing layer(s). Generally speaking, CIGS type photovoltaic devices include, from the front (or light incident) side moving rearwardly, a front transparent cover sheet (or substrate) such as glass, a front electrode comprising a transparent conductive layer(s) (e.g., a transparent conductive oxide), a light absorption semiconductor film (e.g., CIGS), a rear electrode/contact, and a rear substrate of a material such as glass or metal foil for certain example flexible applications. In some instances, an adhesive may be provided between the front substrate and the front electrode. It is also the case in some instances that the device is provided with window layer(s) (e.g., of or including CdS, ZnO, or the like). Photovoltaic power is generated when light incident on the front side (or front substrate) of the device passes through the front electrode and is absorbed by the light absorption semiconductor film (e.g., CIGS) as is known in the art.

For example, with reference to FIG. 1, there is generally provided a schematic cross-sectional diagram illustrating various elements of a CIGS-type photovoltaic device 10. The solar cell includes a rear glass substrate (or back glass) 12. A back contact made up of a metal layer, such as, for example, molybdenum (Mo) 14 is typically deposited on the rear glass substrate 12. The first active region of the device 10 comprises a semiconductor layer 16 which is typically a p-type copper indium/gallium diselenide (CIGS) which may be deposited by coevaporation. A thin "window" layer of n-type compound semiconductor 18, typically comprising cadmium sulfide (CdS), may then be wet deposited on CIGS layer 16. A front electrode 20 (e.g., of conductive zinc oxide) is deposited on the CdS layer 18 and acts as a transparent front contact for the photovoltaic device 10. The device 10 may be completed by including a series of front face contacts (not shown) in the form of, for example, a metal grid on top of the transparent front contact 20 to facilitate the extraction of generated electrons, and a front glass substrate 22. A large solar cell may also be divided into a number or smaller cells by means of scribes, such as, for example, laser or mechanical scribes or the like, traditionally referred to as P1, P2 and P3, which allow individual cells to be connected in series.

As noted above, a metal such as Mo may be used as the rear electrode (or back contact) 14 of a photovoltaic device, such as, for example, a CIGS solar cell 10, to extract positive charges (holes) generated in the CIGS semiconductor absorber 16. In certain instances, the Mo rear electrode 14 may be sputter-deposited using, for example, direct-current magnetron sputtering, onto the back glass substrate 12. However, using Mo alone as the material for the back contact 14 of the solar cell 10 suffers from certain disadvantages. For example, Mo has a relatively high material cost and sometimes suffers from the problem of delamination from the back glass substrate. In addition, Mo typically exhibits relatively low conductivity and suffers from a relatively slow deposition rate, and thus causes correspondingly low production line throughput. As a result, using Mo as the material for the back contact accounts for a substantial portion of the total device cost. Moreover, a frequent desire for a back contact for CIGS type solar cells is to achieve a sheet resistance ($R_s$) on the order of less than or equal to about 1 ohm/square. In order for a pure Mo back contact to alone meet this requirement, the Mo thickness must typically range from 300-900 nm, depending upon the CIGS deposition method. In other words, the thicker the film, the lower its sheet resistance. This results in the back contact making up about 15-25% of the total photovoltaic module cost.

Attempts have been made to use other types of metals as the sole material to form the back contact. These attempts have resulted in limited success with only a few other materials, such as, for example, tungsten (W), tantalum (Ta) and niobium (Nb), exhibiting sufficient compatibility with the CIGS absorber, e.g., not reacting with the CIGS absorber. However, these alternatives result in a lower CIGS device efficiency as compared to devices using Mo as the material for the back contact.

In certain example embodiments of this invention, a substantial portion of the Mo back contact is substituted with copper (Cu), which is a less expensive and a more conductive alternative. It has been found that substituting Cu for a portion of the Mo of the back contact does not significantly compromise cell performance in a CIGS cell. The many advantages of using Cu as the bulk (or at least part) of the back contact include, for example, lower cost—Cu sputtering targets are typically at least two times less expensive than using Mo sputtering targets. Additionally, the sputter deposition rates of Cu are typically at least two times greater than that of Mo. Another advantage of using Cu in the back contact is that sputtered Cu has greater conductivity as compared to sputtered Mo. The Cu portion of the rear electrode/contact is preferably separated from the CIGS absorber by at least a layer of or including Mo.

When a Cu layer is provided in the rear electrode, a Mo layer is provided as part of the rear electrode/contact between the Cu layer and the CIGS absorber in order to prevent or reduce Se penetration into the Cu so that significant Se from the CIGS does not react with the Cu during the high-temperature selenization process. One or both of the Cu and/or Mo layers may be reflective layers in certain example embodiments. In example embodiments of this invention, in order to allow for a reduced thickness of the conductive Mo inclusive layer, a selenium blocking layer(s) is located between the conductive Cu based layer and the conductive Mo inclusive layer in the rear electrode/contact. The selenium blocking layer may contain, for example, Cu and at least one more element selected so that its enthalpy of formation is smaller compared to copper selenide so that there is no or substantially no replacement of the portion of the compound material with selenium. The selenium blocking layer may be of or include CuO, $Cu_2O$, $CuN_2O_6$, $CuN_2$ and/or MoN in certain example embodiments of this invention.

In certain example embodiments of this invention, there is provided a photovoltaic device, comprising: a front substrate; a semiconductor absorber film; a rear contact comprising a first conductive layer comprising copper, a second conductive layer comprising molybdenum, and a selenium blocking layer located between at least the first conductive layer comprising copper and the second conductive layer comprising molybdenum; and a rear substrate; wherein the first conductive layer comprising copper is located between at least the rear substrate and the selenium blocking layer, and wherein the semiconductor absorber film is located between at least the back contact and the front substrate.

In certain example embodiments of this invention, there is provided a method of making a coated article for use in a photovoltaic device, the method comprising: providing a substrate; depositing a conductive layer comprising Cu over at least said substrate; depositing a selenium blocking layer on the substrate over at least the conductive layer comprising Cu; depositing a conductive layer comprising Mo on the substrate over at least the first conductive layer and the selenium blocking layer; and forming a CIGS absorber film over at least said second conductive layer.

In certain example embodiments of this invention, there is provided a photovoltaic device comprising: a front substrate (e.g., glass substrate); a semiconductor absorber film (e.g., CIGS inclusive); a rear contact comprising a conductive layer comprising copper, a layer comprising molybdenum which may or may not be conductive, and a layer comprising an oxide and/or nitride of copper located between at least the conductive layer comprising copper and the layer comprising molybdenum. The device further includes a rear substrate (e.g., glass or foil substrate), wherein the conductive layer comprising copper is located between at least the rear substrate and the layer comprising the oxide and/or nitride of copper, and wherein the semiconductor absorber film is located between at least the back contact and the front substrate.

These and other example embodiments and example advantages are described herein with respect to certain example embodiments and with reference to the following drawings in which like reference numerals refer to like elements, and wherein:

DETAILED DESCRIPTION OF EXAMPLE EMBODIMENTS

Figure 1:
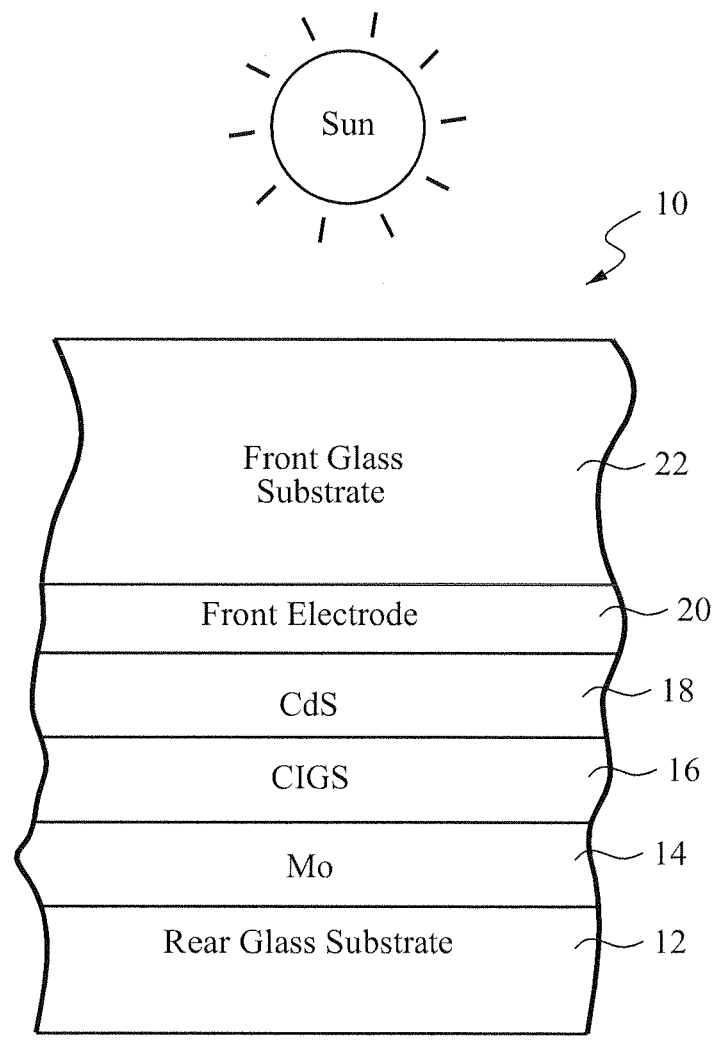
FIG. 1 is a cross sectional view of an example known CIGS photovoltaic device.

Referring now more particularly to the figures in which like reference numerals refer to like elements in the several views, detailed descriptions of example embodiments are disclosed herein.

Photovoltaic devices such as solar cells convert solar (or other light) radiation into usable electrical energy. The energy conversion typically occurs as a result of the photovoltaic effect. Light radiation (such as, for example, sunlight) impinging on a photovoltaic device and absorbed by an active region of semiconductor material (e.g., a semiconductor film including one or more semiconductor layers, such as, for example, CIGS), sometimes called an absorbing layer or film, generates electron-hole pairs in the active region. The electrons and holes may be separated by an electric field of a junction in the photovoltaic device. The separation of electrons and holes by the junction results in the generation of an electric current and voltage. In certain example embodiments, the electrons flow toward the region of the semiconductor material having n-type conductivity, and holes flow toward the region of the semiconductor having p-type conductivity. Current can flow through an external circuit connecting the n-type region to the p-type region (or vice versa) as impinging light energy continues to generate electron-hole pairs in the photovoltaic device.

Figure 2:
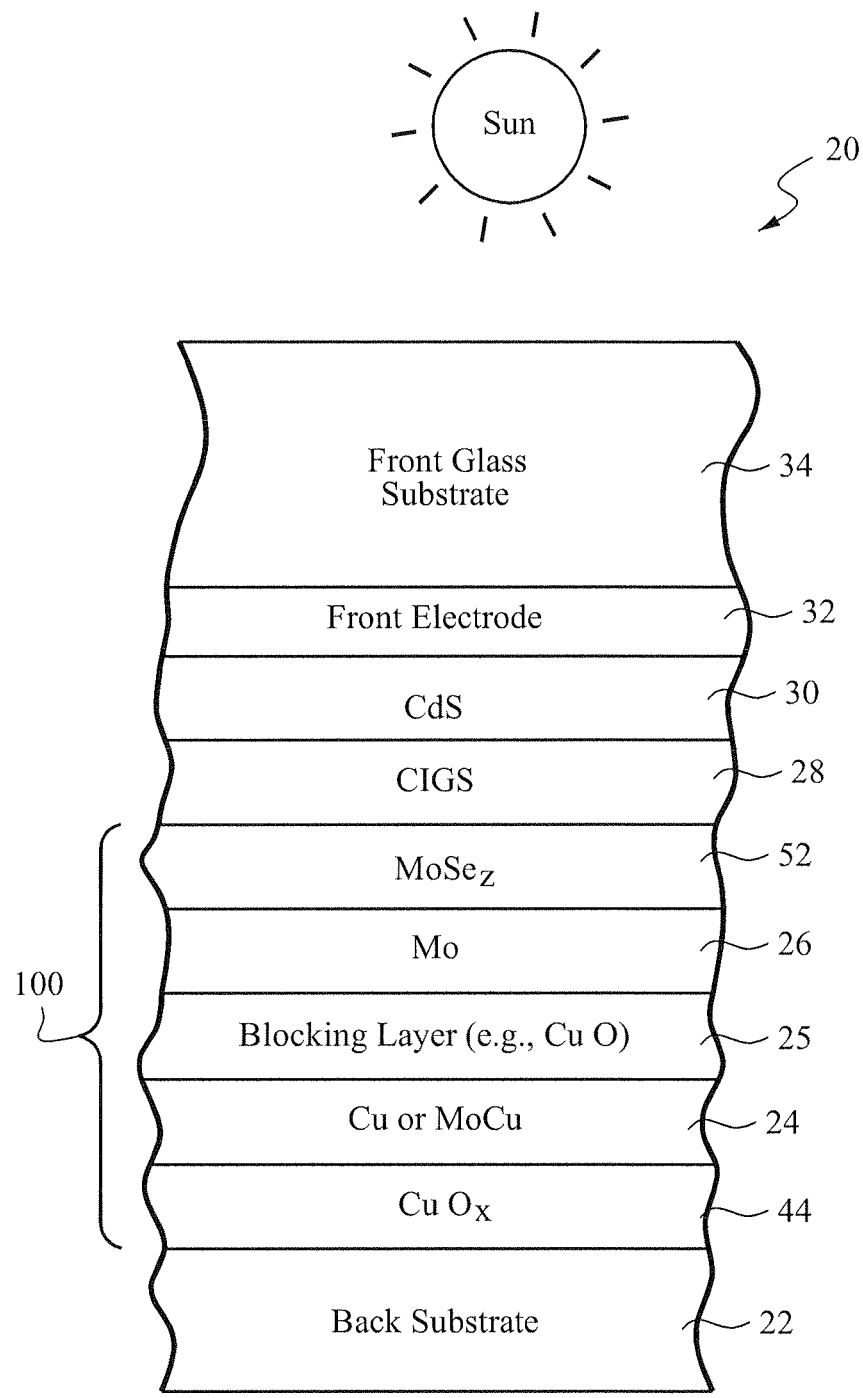
FIG. 2 is a cross sectional view of an example photovoltaic device according to certain example embodiments disclosed herein.

Referring to FIG. 2, in certain example embodiments of this invention a substantial portion of the Mo inclusive back contact is substituted with copper (Cu) 24, which is a less expensive and a more conductive alternative compared to Mo. It has been found that substituting Cu for a portion (24 and/or 44) of the Mo of the back contact does not significantly compromise cell performance in a CIGS cell (of course, it will be understood that Cu used in back contact configurations may include certain trace or minor amounts of other elements of materials that do not substantially affect the performance or electrical characteristics of Cu, and as discussed herein, Cu may include an oxidation graded layer of Cu). The many advantages of using Cu as the bulk (or at least part) of the back contact include, for example, lower cost—Cu sputtering targets are typically at least two times less expensive than using Mo sputtering targets. Additionally, the sputter deposition rates of Cu are typically at least two times greater than that of Mo. For example, and without limitation, deposition rates for Mo tend to range from about 2.8 to 3.6 nm/kW, while deposition rates for Cu tend to range from about 7.2 to 8.2 nm/kW, thereby providing improvements in throughput and thus more efficient and faster manufacturing. Another advantage of using Cu in the back contact is that sputtered Cu has 4 to 5 times greater conductivity as compared to sputtered Mo. For example, and without limitation, sputtered Cu conductivity may be about $60.7 \times 10^6$ $Sm^{-1}$, as compared to $15.5 \times 10^6$ $Sm^{-1}$ for Mo. Therefore, in order to reach substantially the same sheet resistance as a simple Mo back contact, a multi-layer back contact configuration including Cu and Mo can be made much thinner than using Mo alone. Moreover, Cu is compatible with the CIGS absorber since Cu is a main component of the CIGS absorber. The Cu portion (24 and/or 44) of the rear electrode/contact is preferably separated from the CIGS absorber 28 by at least a layer of or including Mo 26, so only traces of Cu from the back contact may reach the CIGS absorber 28 due to heating/diffusion without substantially altering its stoichiometry. It will also be understood that the Cu (24 and/or 44) may include trace or minor amounts of other elements or materials that do not substantially affect the performance or electrical properties of Cu.

When a Cu layer 24 is provided in the rear electrode, a Mo layer 26 is provided as part of the rear electrode/contact between the Cu layer 24 and the CIGS absorber 28 in order to reduce Se penetration into the Cu 24 so that significant Se from the CIGS 28 does not react with the Cu 24 during the high-temperature selenization process. One or both of the Cu 24 and/or Mo 26 layers may be reflective layers in certain example embodiments. If only a Mo layer 26 is provided between the Cu 24 and the CIGS 28, then the Mo layer would have to be fairly thick which would increase the cost of the photovoltaic device.

In example embodiments of this invention, in order to allow for a reduced thickness of the conductive Mo inclusive layer 26, at least one selenium blocking layer 25 is located between at least the conductive Cu based layer 24 and the conductive Mo inclusive layer 26 in the rear electrode/contact. The selenium blocking layer 25 may contain Cu and at least one more element selected so that its enthalpy of formation is smaller compared to copper selenide so that there is no or substantially no replacement of the portion of the compound material in layer 25 with selenium. The absolute number of the negative energy is larger compared to that of CuSe. The selenium blocking layer 25 need not block all selenium, but it is capable of blocking significant Se if needed in order to limit, reduce and/or prevent Se penetration into the Cu layer 24 so that significant Se from the CIGS does not react with the Cu layer 24 during the high-temperature selenization process. The selenium blocking layer 25 may be of or include CuO (e.g., enthalpy of formation about −157 kJ/mol), $Cu_2O$ (e.g., enthalpy of formation about −169 kJ/mol), $CuN_2O_6$ (e.g., enthalpy of formation about −303 kJ/mol), $CuN_2$ (e.g., enthalpy of formation about −39 kJ/mol), and/or MoN in certain example embodiments of this invention. In certain example embodiments, the enthalpy of formation of selenium blocking layer 25 may be from about −39 to −303, more preferably from about −100 to −200. The selenium blocking layer 25 may be from about 5-200 nm thick in certain example embodiments, more preferably from about 15-75 nm thick, more preferably from about 20-40 nm thick, with an example thickness being about 30 nm. The selenium blocking layer 25 may be deposited on substrate 22 via sputtering in certain example embodiments.

In certain example embodiments disclosed herein, a stress matching or adhesion layer 44 of or including copper oxide (e.g., $CuO_X$) may be formed between the back substrate 22 (e.g., glass or foil substrate) and copper based layer 24. Optionally, the copper based layer 24 may be an oxidation graded copper layer having greater oxidation at a portion adjacent the back substrate 22, such that the portion having the greater oxygen concentration can provide a stress matching function of a copper oxide stress matching layer. It will be understood in example embodiments including an oxidation graded conductive layer, the grading need not be continuous, and may be discontinuous. By providing a stress matching/adhesion layer 44 and/or oxidation graded Cu layer 24, improved adhesion of the Cu layer 24 to the back substrate 22 may be achieved.

In accordance with these and other example embodiments disclosed herein, a portion 26 of the back contact between the Cu and the CIGS absorber may continue to be of or including Mo. The use of Mo 26 and the selenium blocking layer(s) 25 between the Cu 24 and the CIGS absorber 28 has numerous operational and structural advantages. Among these advantages is that Mo forms a thin molybdenum selenide ($MoSe_2$) layer 52 at its interface with the CIGS absorber 28 during the high-temperature selenization process used to form the CIGS absorber 28. The formation of a $MoSe_2$ layer 52 is beneficial for the CIGS device in that it results in the formation of an ohmic (non-rectifying) contact to the CIGS absorber which, in turn, facilitates hole extraction with minimum losses. Another advantage of continuing to use Mo 26 between the Cu 24 and the CIGS absorber 28 is that Mo works well with the optional second mechanical scribe in the CIGS photovoltaic module manufacturing process. Sputter deposited Mo also produces a specific surface morphology that is beneficial for CIGS growth and particularly for the formation of crystallites with large grains sizes that result in high carrier mobility and thus, higher device efficiency. And the selenium blocking layer 25 between the Cu inclusive layer 24 and the Mo inclusive layer 26 is advantageous for the reasons discussed herein.

In certain example embodiments disclosed herein, the absorption film, or absorber, 28 may be of or include CIGS (approximately Cu(In, Ga)(Se, $S)_2$). In certain example embodiments disclosed and described herein, there is provided a rear opaque and/or reflective electrode 100 for CIGS photovoltaic (e.g., solar cell) devices that is deposited using magnetron sputter-deposition of at least molybdenum (Mo) and copper (Cu) in a multi-layer configuration. The thickness of the Mo layer 26 may be, for example, preferably in the range of 1-500 nm (more preferably from 10-300 nm, and even more preferably from 20-100 nm, and even more preferably from 20-60 nm) and the thickness of the Cu layer 24 may be, for example, preferably in the range of 20-200 nm (more preferably from 30-150 nm). In certain example embodiments, the back contact 100 may have a reduced thickness compared to conventional pure Mo back contacts.

Optionally, stress matching or adhesion layer 44 of or including copper oxide ($CuO_X$) may be provided between the Cu layer 24 and the back glass substrate 22. A $CuO_X$ layer 44 provided adjacent the back glass substrate 22 and between the back glass substrate 22 and the Cu layer 24 is used to form a solid bond between the Cu 24 and the back glass substrate 22, as metal copper does not generally stick well to the glass. The $CuO_X$ layer 44 may be stoichiometric, or substoichiometric, in example embodiments. This stress matching or adhesion layer 44 of or including $CuO_X$ may be deposited by reactive sputtering from a metal Cu target in an argon and oxygen ($Ar+O_2$) atmosphere, with oxygen partial pressures being, for example, and without limitation, around about 0.3 to 0.6 mTorr. The resulting thickness of the $CuO_X$ matching/adhesion layer 44 is, for example, preferably in a range of 3-50 nm. Other possible alternatives for matching/adhering Cu to the back glass substrate may include, for example, and without limitation, a thin (e.g., ~1-10 nm) titanium (Ti) or chromium (Cr) based layer. Alternatively, the conductive copper layer 24 may be an oxidation graded copper layer having greater oxidation at a portion adjacent the back glass substrate, such that the portion having the greater oxygen concentration can provide the stress matching function of a copper oxide stress matching layer. It will be understood in example embodiments including an oxidation graded conductive layer, the grading need not be continuous, and may be discontinuous. By providing a stress matching/adhesion layer 44 and/or an oxidation graded Cu layer 24, improved adhesion of the Cu to the back glass substrate 22 may be achieved.

With reference to FIG. 2, a cross section of an example CIGS photovoltaic device including a multi-layer back contact configuration comprising Mo and Cu according to an example embodiment is illustrated. The photovoltaic device (e.g., solar cell 20) is structurally supported on a back glass substrate 22, which may, for example, and without limitation, comprise soda-lime-silica based glass or foil. A multi-layer back contact structure 100 comprising a conductive layer of or including Cu 24 and a conductive layer of or including Mo 26 is deposited on the back glass substrate 22. In an example embodiment, a preferred method of depositing the Cu layer 24 and the Mo layer 26 is by direct-current magnetron beam sputtering. Optionally, a dielectric layer (not shown) (e.g., of or including silicon nitride and/or silicon oxynitride) may be provided directly on the back substrate 22 so as to be located between the back substrate 22 and the Cu based layer 24. Thus, in different embodiments regarding FIG. 2, the Cu inclusive layer 24 may be (i) metallic Cu, (ii) mostly metallic Cu or CuMo, (iii) oxidation graded, (iv) a CuMo alloy, and/or (v) made up of a metallic layer portion and an oxygen inclusive layer portion where the oxygen inclusive layer portion is closer to the substrate 22.

Still referring to FIG. 2, after layers 24, 25 and 26 (and optionally 44) have been formed on substrate 22, the active or absorbing region of the device 20 is then formed on the Mo based layer 26 of the back contact, and preferably contains a semiconductor film 28 comprising copper indium diselenide and/or p-type CIGS layer (approximately $Cu(In, Ga)(Se, S)_2$). The CIGS layer 28 may be deposited by co-evaporation, sputtering, electroplating or any other suitable method. For example, and without limitation, an example method of forming CIGS begins with providing a layer of or including deposited Cu (using electroplating or any other deposition technique, as noted above), other components of the CIGS, e.g., indium and/or gallium are deposited on a Cu layer and then react with the Cu at high temperatures in a selenium atmosphere, forming the CIGS semiconductor absorber 28. Formation of the CIGS absorber layer 28 may optionally be followed by wet-deposition of a cadmium sulfide (CdS) window layer 30. The device 20 may then be provided with a wide bandgap conductor or semiconductor material 32 by deposition of, for example, a substantially transparent conductive layer of or including tin oxide, zinc oxide, zinc aluminum oxide, or any other suitable transparent conductive electrode 32. In a preferred, non-limiting, example, a bi-layer 32 of or including a ZnO layer and an n-type conductive Al-doped ZnO layer may be deposited on the CdS window layer 30. The ZnO/ZnO:Al transparent conductive film 32 may serve as a front transparent electrode/contact of the photovoltaic device 20. The device 20 may then be finished by providing a series of front face contacts in the form of, for example, a metal grid (not shown), on top of the transparent front contact 32 to facilitate extraction of generated electrons, and a front (light incident side) glass substrate 34.

While a preferred embodiment according to the FIG. 2 embodiment is made up of the layers shown in FIG. 2, other non-illustrated layer(s) may also be provided. For example, an anti-reflection film (not shown) may be provided on the light incident side of the front substrate 22, a further electrode or dielectric layer(s) may be provided between the front substrate 34 and the front electrode 32, and so forth.

It is noted that substituting a portion of the traditional Mo back contact with Cu (a part of which can also be MoCu alloy as discussed above) according to certain example embodiments of this invention does not substantially change the band diagram and facilitates hole extraction with minimal losses. This is due to the fact that Cu has a substantially similar work function as Mo (e.g., about 4.6 eV), and that the width of the carrier depletion region in the metal is negligible. Moreover, the use of $CuO_X$ adjacent to the back glass substrate does not significantly impact current flow between individual cells.

In example embodiments of this invention, there is provided a photovoltaic device, comprising: a front substrate; a semiconductor absorber film; a rear contact comprising a first conductive layer comprising copper, a second conductive layer comprising molybdenum, and a selenium blocking layer located between at least the first conductive layer comprising copper and the second conductive layer comprising molybdenum; and a rear substrate; wherein the first conductive layer comprising copper is located between at least the rear substrate and the selenium blocking layer, and wherein the semiconductor absorber film is located between at least the back contact and the front substrate.

In the photovoltaic device of the immediately preceding paragraph, the semiconductor absorber film may be of or include CIGS.

In the photovoltaic device of any of the preceding two paragraphs, the selenium blocking layer may comprise or consist essentially of an oxide of copper.

In the photovoltaic device of any of the preceding three paragraphs, the selenium blocking layer may comprise or consist essentially of copper, oxygen and nitrogen.

In the photovoltaic device of any of the preceding four paragraphs, the selenium blocking layer may comprise or consist essentially of $CuO$, $Cu_2O$, $MoN$, or $CuN_2O_6$.

In the photovoltaic device of any of the preceding five paragraphs, the selenium blocking layer may have an enthalpy of formation smaller than that of copper selenide.

In the photovoltaic device of any of the preceding six paragraphs, the selenium blocking layer may be located between and directly contacting the first conductive layer comprising copper and the second conductive layer comprising molybdenum.

In the photovoltaic device of any of the preceding seven paragraphs, the first conductive layer comprising copper may include an oxidation graded portion wherein oxygen concentration is higher at a region closer to the rear substrate and is lower at a region closer to the second conductive layer comprising molybdenum.

The photovoltaic device of any of the preceding eight paragraphs may further comprise a layer comprising or consisting essentially of copper oxide located between the rear substrate and the first conductive layer comprising copper.

In the photovoltaic device of any of the preceding nine paragraphs, the rear substrate may be of glass.

The photovoltaic device of any of the preceding ten paragraphs may further comprise an ohmic contact layer comprising $MoSe_2$ formed between the semiconductor absorber and the second conductive layer.

The photovoltaic device of any of the preceding eleven paragraphs may further comprise a substantially transparent conductive front contact comprising a substantially transparent metal oxide.

In the photovoltaic device of any of the preceding twelve paragraphs, the first conductive layer may consist essentially of Cu or MoCu.

In the photovoltaic device of any of the preceding thirteen paragraphs, the second conductive layer may consist essentially of Mo.

In the photovoltaic device of any of the preceding fourteen paragraphs, the selenium blocking layer may be from about 5-200 nm thick, more preferably from about 15-75 nm thick.

In the photovoltaic device of any of the preceding fifteen paragraphs, the second conductive layer comprising molybdenum may be from about 10-300 nm thick, more preferably from about 20-100 nm thick.

In the photovoltaic device of any of the preceding sixteen paragraphs, the first conductive layer comprising copper may be from about 20-200 nm thick.

While certain example aspects of a coated article for use in photovoltaic devices and methods for making the same are described and discussed with respect to various example embodiments herein, it is to be understood that these example embodiments are meant to illustrative, not limiting. One skilled in the art would understand that various modifications may be made without departing from the true spirit and full scope of the following claims.

What is claimed is:

1. A method of making a coated article for use in a photovoltaic device, the method comprising:
   providing a substrate;
   depositing a conductive layer comprising Cu over at least said substrate;
   depositing a selenium blocking layer on the substrate over at least the conductive layer comprising Cu, wherein the selenium blocking layer consists essentially of an oxide of copper which may optionally be nitrided;
   depositing a conductive layer comprising Mo on the substrate over at least the conductive layer comprising Cu and the selenium blocking layer; and
   forming a CIGS absorber film over at least said conductive layer comprising Mo.

2. The method of claim 1, wherein said forming a CIGS absorber film comprises:
   depositing a seed layer comprising copper;
   depositing indium and/or gallium over said seed layer; and
   heat treating said seed layer including said indium and/or gallium in an atmosphere including selenium.

3. The method of claim 1, wherein the selenium blocking layer consists essentially of copper, oxygen and nitrogen.

4. The method of claim 1, wherein the selenium blocking layer has an enthalpy of formation smaller than that of copper selenide.

5. The method of claim 1, wherein the selenium blocking layer is located between and directly contacting the conductive layer comprising Cu and the conductive layer comprising Mo.

6. A method of making a coated article for use in a photovoltaic device, the method comprising:
   having a glass substrate;
   depositing a conductive layer comprising Cu over at least said glass substrate;
   depositing a selenium blocking layer on the substrate over at least the conductive layer comprising Cu, wherein the selenium blocking layer consists essentially of an oxide of copper which may optionally be nitrided;
   depositing a conductive layer comprising Mo on the substrate over at least the conductive layer comprising Cu and the selenium blocking layer; and
   wherein the coated article is configured so that a CIGS absorber film can be formed over at least said conductive layer comprising Mo.

7. The method of claim 6, wherein the selenium blocking layer has an enthalpy of formation smaller than that of copper selenide.

8. The method of claim 6, wherein the selenium blocking layer is located between and directly contacting the conductive layer comprising Cu and the conductive layer comprising Mo.

* * * * *